United States Patent
Uchida

(10) Patent No.: US 7,755,399 B2
(45) Date of Patent: Jul. 13, 2010

(54) HIGH SPEED COMPARATOR CIRCUIT WITH OFFSET CANCELLATION

(75) Inventor: Toshiyuki Uchida, Chiba (JP)

(73) Assignee: Seiko Instruments Inc., Chiba (JP)

( * ) Notice: Subject to any disclaimer, the term of this patent is extended or adjusted under 35 U.S.C. 154(b) by 26 days.

(21) Appl. No.: 11/960,284

(22) Filed: Dec. 19, 2007

(65) Prior Publication Data
US 2008/0197887 A1    Aug. 21, 2008

(30) Foreign Application Priority Data

Dec. 21, 2006  (JP)  ............................. 2006-344413
Nov. 9, 2007   (JP)  ............................. 2007-291686

(51) Int. Cl.
*G11C 27/02*  (2006.01)

(52) U.S. Cl. ............................. 327/94; 327/95; 327/337
(58) Field of Classification Search .................. 327/94, 327/95, 337
See application file for complete search history.

(56) References Cited

U.S. PATENT DOCUMENTS

| | | | | |
|---|---|---|---|---|
| 4,302,689 A | * | 11/1981 | Brodie | ......................... 327/95 |
| 4,578,646 A | * | 3/1986 | Maio et al. | .................. 327/341 |
| 4,764,689 A | * | 8/1988 | Thommen | ...................... 327/95 |
| 4,795,987 A | * | 1/1989 | Gay | ............................ 330/107 |
| 4,894,620 A | * | 1/1990 | Nagaraj | ........................ 327/91 |
| 5,331,222 A | * | 7/1994 | Lin et al. | ...................... 327/554 |
| 6,806,745 B2 | * | 10/2004 | Fujimoto | ...................... 327/94 |

FOREIGN PATENT DOCUMENTS

JP    7-92204 A    4/1995

* cited by examiner

*Primary Examiner*—Kenneth B. Wells
(74) *Attorney, Agent, or Firm*—Brinks Hofer Gilson & Lione

(57) ABSTRACT

Provided is a comparator circuit that is capable of operating at high speed and canceling an offset voltage with high precision. The comparator circuit includes a second amplifier circuit for amplifying an output of an amplifier circuit and feeding back the amplified output to an input of the amplifier circuit. When the comparator circuit samples the input voltage, the second amplifier circuit conducts feedback and increases a gain to cancel the offset. Also, when the gain of the amplifier circuit is made lower than the gain of the second amplifier circuit, and the comparator circuit compares the input voltage, the comparing operation can be conducted at high speed by separating the amplifier circuit from the feedback of the second amplifier circuit.

3 Claims, 3 Drawing Sheets

HIGH SPEED COMPARATOR CIRCUIT WITH OFFSET CANCELLATION

RELATED APPLICATIONS

This application claims priority under 35 U.S.C. §119 to Japanese Patent Application Nos. JP2006-344413 filed Dec. 21, 2006 and JP2007-291686 filed Nov. 9, 2007, the entire content of which is hereby incorporated by reference.

BACKGROUND OF THE INVENTION

1. Field of the Invention

The present invention relates to a comparator circuit that is mounted to a semiconductor device.

2. Description of the Related Art

FIG. 5 is a circuit diagram showing a conventional comparator circuit. FIG. 6 is a timing chart showing an on/off operation of a conventional switch.

An input terminal of the comparator circuit is connected to an inverting input terminal of a first amplifier 11 having gain a through a switch 14 and an input capacitor 10. A connection point of the switch 14 and the input capacitor 10 is grounded through a switch 15. A noninverting input terminal of the first amplifier 11 is grounded. An output terminal of the first amplifier 11 is connected to an output terminal of the comparator circuit through a latch circuit 13. Also, an output terminal of the first amplifier 11 is connected to the inverting input terminal of the first amplifier 11 through a switch 16.

The on/off operation of the switches 14 and 16 is controlled according to a clock signal $\Phi1$ shown in FIG. 6, the on/off operation of the switch 15 is controlled according to a clock signal $\Phi2$, and the latch circuit 13 amplifies a voltage at the output terminal of the first amplifier 11 according to the clock signal $\Phi2$.

Next, a description will be given of the operation of the sampling state of a conventional comparator circuit. FIG. 7 is a circuit diagram showing the sampling state of the conventional comparator circuit.

When the clock signal $\Phi1$ becomes high and the clock signal $\Phi2$ becomes low, the comparator circuit becomes the circuit shown in FIG. 7, and is brought into a sampling state. An input voltage Vin at the input terminal of the comparator circuit is sampled to the input capacitor 10.

Now, it is assumed that, in the sampling state, a voltage at the inverting input terminal of the first amplifier 11 is $X_{N1}$, a voltage at the output terminal of the first amplifier 11 is Vo1, an amplification gain of the first amplifier 11 is a, an input voltage at the input terminal of the comparator circuit is Vin, an offset voltage is $V_{OFF}$, and electric charges in the input capacitor 10 are Q1. Then, $X_{N1}$ is represented as follows.

$$X_{N1}=a(0-X_{N1}+V_{OFF}) \quad (1)$$

$$X_{N1}=[a/(1+a)]V_{OFF} \quad (2)$$

Also, Q1 is represented as follows.

$$Q1=C(X_{N1}-\text{Vin})=C[[a/(1+a)]V_{OFF}-\text{Vin}] \quad (3)$$

Next, a description will be given of an operation of a hold and compare state of the conventional comparator circuit. FIG. 8 is a circuit diagram showing the hold and compare state of the conventional comparator circuit.

When the clock signal $\Phi2$ becomes high and the clock signal $\Phi1$ becomes low, the comparator circuit becomes the circuit shown in FIG. 8 and is brought in a hold and compare state. The input terminal of the comparator circuit is grounded, and the input voltage Vin that has been sampled to the input capacitor 10 is compared by the first amplifier 11 and then input to the latch circuit 13.

Now, it is assumed that, in the hold and compare state, a voltage at the inverting input terminal of the first amplifier 11 is $X_{N2}$, a voltage at the output terminal of the first amplifier 11 is Vo2, and the electric charges in the input capacitor 10 are Q2. Then, Q2 is represented as follows.

$$Q2=C(X_{N2}-0)=CX_{N2} \quad (4)$$

Q1 is equal to Q2 according to the law of conservation of charge, so XN2 is represented as follows.

$$Q2=CX_{N2}=Q1=C[[a/(1+a)]V_{OFF}-\text{Vin}] \quad (5)$$

$$X_{N2}=[a/(1+a)]V_{OFF}-\text{Vin} \quad (6)$$

Also, Vo2 is represented as follows.

$$Vo2=a(0-X_{N2}+V_{OFF}) \quad (7)$$

When Expression (6) is substituted for Expression (7), Vo2 is represented as follows.

$$Vo2=a\text{Vin}+[a/(1+a)]V_{OFF} \quad (8)$$

Vo2 in Expression (8) is input to the latch circuit 13, then greatly amplified in synchronization with the clock signal $\Phi2$, and latched.

Further, there has been known a comparator circuit having an offset adjustment terminal (for example, refer to JP07-092204 A).

In the conventional comparator circuit, when an attempt is made to sufficiently cancel the offset voltage $V_{OFF}$ of the first amplifier 11, it is necessary to increase the amplification gain a.

However, in the case where the frequencies of the clock signals $\Phi1$ and $\Phi2$ are made high so as to operate the first amplifier 11 at a high speed, the operation of the first amplifier 11 does not follow the frequencies. As a result, the amplification gain a is lowered. When the amplification gain a is lowered, there arises a problem such that the offset voltage $V_{OFF}$ is insufficiently cancelled as represented by Expression (8).

SUMMARY OF THE INVENTION

The present invention has been made in view of the above drawbacks, and therefore an object of the present invention is to provide a comparator circuit that is capable of canceling an offset voltage with high precision and also operating at high speed.

In order to solve the above problems, the present invention provides a comparator circuit that cancels an offset of an amplifier circuit by sampling and holding an input voltage in an input capacitor, the comparator circuit including a second amplifier circuit for amplifying an output of the amplifier circuit and feeding back the amplified output to an input of the amplifier circuit, in which, when the comparator circuit samples the input voltage, the second amplifier circuit conducts feedback and increases a gain to cancel the offset.

Also, when the gain of the amplifier circuit is made lower than the gain of the second amplifier circuit, and the comparator circuit compares the input voltage, the comparing operation can be conducted at high speed by separating the amplifier circuit from the feedback of the second amplifier circuit.

According to the present invention, the second amplifier circuit that operates during sampling is added to the output of the amplifier circuit. Therefore, it is possible to increase the gain with respect to the input voltage at the input terminal of the comparator circuit during sampling, thereby making it possible to cancel the offset voltage of the amplifier circuit with high precision.

Also, according to the present invention, the amplification gain with respect to the input voltage at the input terminal of the comparator circuit can be lowered during the hold and compare operation. Therefore, it is possible to conduct the high speed comparing operation.

DETAILED DESCRIPTION OF THE PREFERRED EMBODIMENTS

Hereinafter, a description will be given of an embodiment of the present invention with reference to the accompanying drawings.

Figure 1:
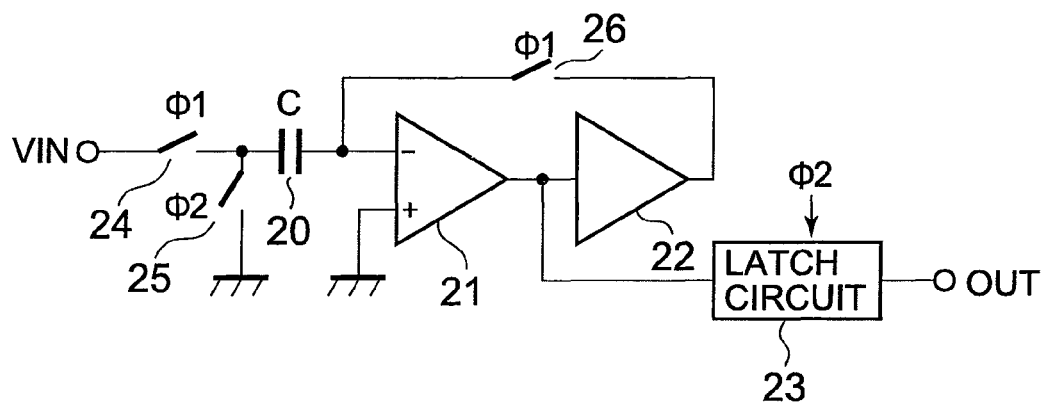
FIG. 1 is a circuit diagram showing a comparator circuit according to the present invention.
Figure 2:
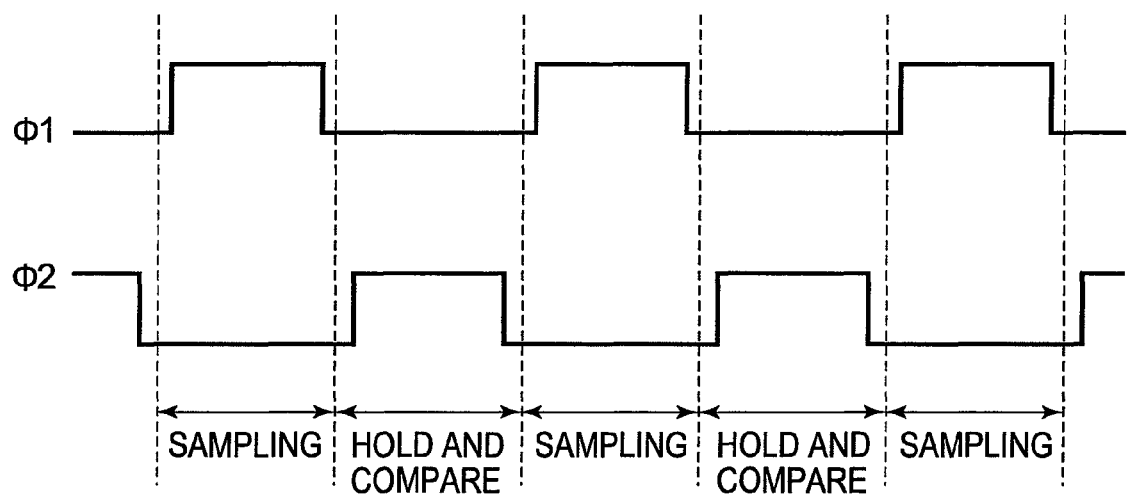
FIG. 2 is a timing chart showing an on/off operation of a switch of the comparator circuit according to the present invention.

FIG. 1 is a circuit diagram showing a comparator circuit according to this embodiment. FIG. 2 is a timing chart showing an on/off operation of a switch of the comparator circuit according to this embodiment.

The comparator circuit according to this embodiment includes switches 24 and 25, a sample and hold input capacitor 20, a first amplifier 21 that is an amplifier circuit having an amplification gain a, a second amplifier 22 that is a second amplifier circuit having an amplification gain A, and a latch circuit 23.

The switch 24 is connected between an input terminal VIN of the comparator circuit and one terminal of the input capacitor 20. The switch 25 is connected between the ground and the one terminal of the input capacitor 20. Another terminal of the input capacitor 20 is connected to an inverting input terminal of the first amplifier 21. A noninverting input terminal of the first amplifier 21 is grounded. An output terminal of the first amplifier 21 is connected to an output terminal OUT of the comparator circuit through the latch circuit 23. Also, the output terminal of the first amplifier 21 is connected to an input terminal of the second amplifier 22. An output terminal of the second amplifier 22 is connected to the inverting input terminal of the first amplifier 21 through a switch 26.

The amplification gain a (for example, 10 times) of the first amplifier 21 is set to be lower than the amplification gain A (for example, 100 times) of the second amplifier 22. The first amplifier 21 and the second amplifier 22 are used in a sampling state, and only the first amplifier 21 is used in a hold and compare state.

The on/off operation of the switches 24 and 26 is controlled according to a clock signal $\Phi 1$ shown in FIG. 2. The on/off operation of the switch 25 is controlled according to a clock signal $\Phi 2$ shown in FIG. 2. The latch circuit 23 amplifies and latches voltage at the output terminal of the first amplifier 21 according to the clock signal $\Phi 2$. As shown in FIG. 2, a phase of the clock signal $\Phi 1$ and a phase of the clock signal $\Phi 2$ are complementary with each other. Also, there exists a period in which the clock signal $\Phi 1$ and the clock signal $\Phi 2$ become low at the same time. Accordingly, there exists a period in which all of the switches become off at the same time.

Figure 3:
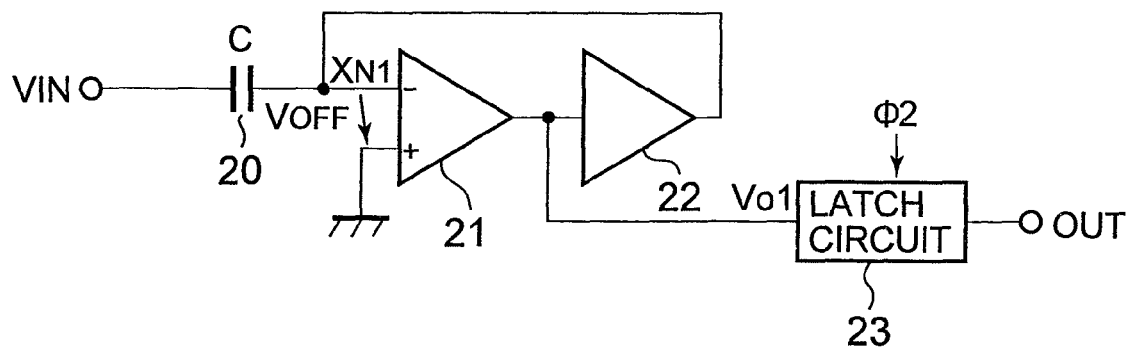
FIG. 3 is a circuit diagram showing a sampling state of the comparator circuit according to the present invention.

Next, a description will be given of an operation of the sampling state of the comparator circuit according to this embodiment. FIG. 3 is a circuit diagram showing a sampling state of the comparator circuit according to this embodiment.

When the clock signal $\Phi 1$ becomes high and the clock signal $\Phi 2$ becomes low, the switches 24 and 26 become on and the switch 25 becomes off. The comparator circuit becomes a circuit shown in FIG. 3, and is brought into a sampling state. An input voltage Vin at the input terminal of the comparator circuit is sampled to the input capacitor 20. Also, feedback based on an amplification gain aA resulting from multiplying the amplification gain a of the first amplifier 21 by the amplification gain A of the second amplifier 22 is conducted from the output terminal of the second amplifier 22 to the inverting input terminal of the first amplifier 21.

Now, it is assumed that, in the sampling state, a voltage at the inverting input terminal of the first amplifier 21 is $X_{N1}$, a voltage at the output terminal of the first amplifier 21 is Vo1, the amplification gain of the first amplifier 21 is a, an amplification gain of the second amplifier 22 is A, an input voltage at the input terminal of the comparator circuit is Vin, an offset voltage is $V_{OFF}$, and electric charges of the input capacitor 20 are Q1. Then, $X_{N1}$ is represented as follows.

$$X_{N1}=aA(0-X_{N1}+V_{OFF}) \quad (9)$$

$$X_{N1}=[aA/(1+aA)]V_{OFF} \quad (10)$$

Also, Q1 is represented as follows.

$$Q1=C(C_{N1}-\text{Vin})=C[[aA/(1+aA)]V_{OFF}-\text{Vin}] \quad (11)$$

Figure 4:
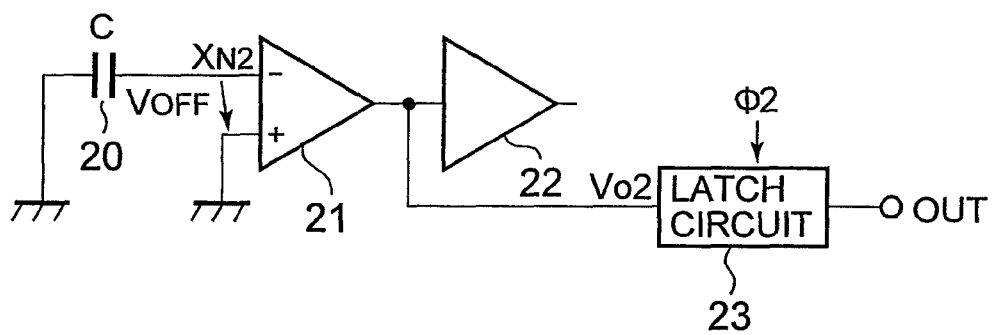
FIG. 4 is a circuit diagram showing a hold and compare state of the comparator circuit according to the present invention.
Figure 5:
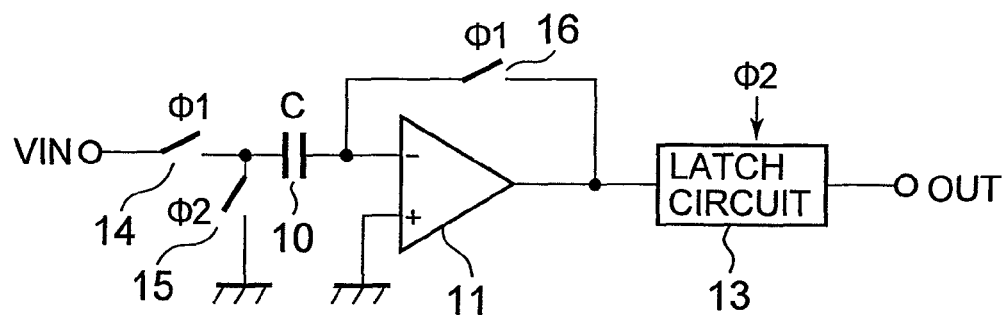
FIG. 5 is a circuit diagram showing a conventional comparator circuit.
Figure 6:
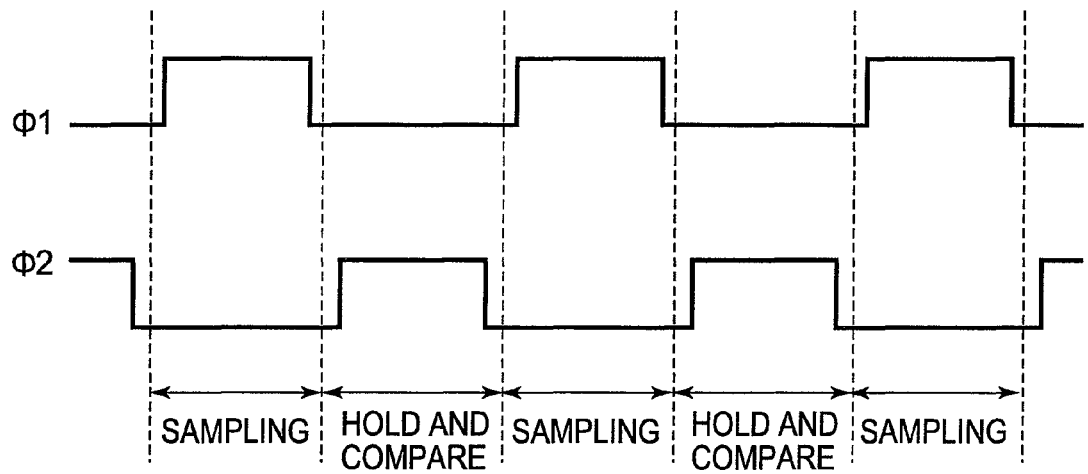
FIG. 6 is a timing chart showing an on/off operation of a switch of the conventional comparator circuit.
Figure 7:
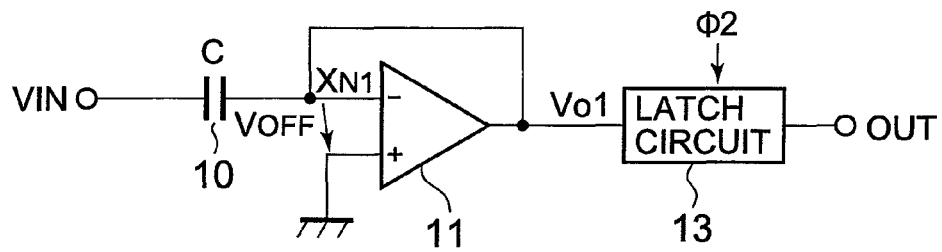
FIG. 7 is a circuit diagram showing a sampling state of the conventional comparator circuit.
Figure 8:
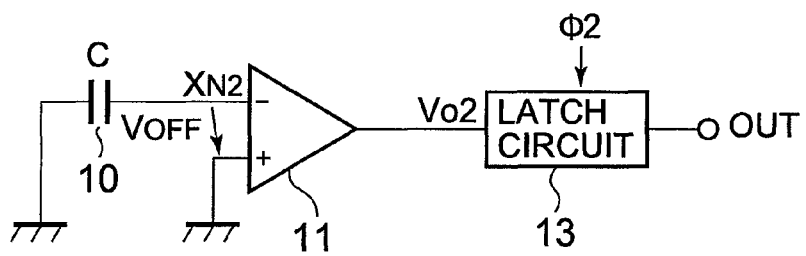
FIG. 8 is a circuit diagram showing a hold and compare state of the conventional comparator circuit.

Next, a description will be given of an operation of the hold and compare state of the comparator circuit of this embodiment. FIG. 4 is a circuit diagram showing the hold and compare state of the conventional comparator circuit.

When the clock signal $\Phi 2$ becomes high and the clock signal $\Phi 1$ becomes low, the switches 24 and 26 become off and the switch 25 becomes on, the comparator circuit becomes a circuit shown in FIG. 4 and is brought into the hold and compare state. The input terminal of the comparator circuit is grounded, and the input voltage Vin that has been sampled to the input capacitor 20 is compared by the first amplifier 21 and then input to the latch circuit 23.

Now, it is assumed that, in the hold and compare state, a voltage at the inverting input terminal of the first amplifier 21 is $X_{N2}$, a voltage at the output terminal of the first amplifier 21 is Vo2, and electric charges of the input capacitor 20 are Q2. Then, Q2 is represented as follows.

$$Q2=C(X_{N2}-0)=CX_{N2} \quad (12)$$

Q1 is equal to Q2 according to the law of conservation of charge, so $X_{N2}$ is represented as follows.

$$Q2=CX_{N2}=Q1=C[[a/(1+a)]V_{OFF}-\text{Vin}] \quad (13)$$

$$XN_2=[aA/(1+aA)]V_{OFF}-\text{Vin} \quad (14)$$

Also, Vo2 is represented as follows.

$$Vo2 = a(0 - X_{N2} + V_{OFF})  \quad (15)$$

When Expression (14) is substituted for Expression (15), Vo2 is represented as follows.

$$Vo2 = a\text{Vin} + [a/(1+aA)]V_{OFF} \quad (16)$$

Vo2 in Expression (16) is input to the latch circuit 23, then greatly amplified in synchronization with the clock signal Φ2. As a result, the voltage at the output terminal of the comparator circuit becomes substantially the power supply or the ground voltage.

In this case, A>>a, so the following expression is satisfied.

$$a/(1+aA) \approx 0 \quad (17)$$

Also, the following expression is satisfied.

$$Vo2 \approx a\text{Vin} \quad (18)$$

As has been described above, because the second amplifier circuit that operates during sampling is added to the output of the amplifier circuit, it is possible to increase the gain with respect to the input voltage at the input terminal of the comparator circuit during sampling, thereby making it possible to cancel the offset voltage of the amplifier circuit with high precision.

Also, because the amplification gain with respect to the input voltage Vin at the input terminal of the comparator circuit can be lowered during the hold and compare operation, it is possible to conduct the high speed comparing operation. Further, there is an advantage in that the mirror capacitor viewed from the input terminal VIN of the comparator circuit becomes small.

In the comparator circuit according to this embodiment, the noninverting input terminal of the first amplifier 21 is grounded. Alternatively, an appropriate potential can be given to the noninverting input terminal. Also, the switch 25 is grounded between the input capacitor 20 and the ground. Alternatively, the switch 25 can be connected between the input capacitor 20 and an appropriate potential.

The comparator circuit according to the present invention is suitable for an AD converter or a DA converter which requires a comparing operation at high speed and with high precision.

What is claimed is:

1. A comparator circuit, comprising:
   a comparator circuit input terminal;
   an input capacitor having one end connected to the comparator circuit input terminal through a first switch and to the ground through a second switch;
   an amplifier circuit having a first input terminal connected to another end of the input capacitor and a second input terminal connected to a comparison potential;
   a second amplifier circuit having an input terminal connected to an output terminal of the amplifier circuit, and an output terminal connected to the first input terminal of the amplifier circuit through a third switch; and
   a latch circuit having an input terminal connected to the output terminal of the amplifier circuit and an output terminal connected to a comparator circuit output terminal,
   wherein during a sample operation the third switch is in a connection state and the second amplifier amplifies an output of the amplifier circuit.

2. The comparator circuit according to claim 1, wherein the third switch is in a disconnection state during a compare and hold operation.

3. The comparator circuit according to claim 1, wherein a gain of the amplifier circuit is lower than a gain of the second amplifier circuit.

* * * * *